United States Patent
Nagata

(10) Patent No.: US 12,512,804 B2
(45) Date of Patent: Dec. 30, 2025

(54) METHOD FOR MANUFACTURING COMPOSITE SUBSTRATE PROVIDED WITH PIEZOELECTRIC SINGLE CRYSTAL FILM

(71) Applicant: SHIN-ETSU CHEMICAL CO., LTD., Tokyo (JP)

(72) Inventor: Kazutoshi Nagata, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 550 days.

(21) Appl. No.: 17/998,171

(22) PCT Filed: Apr. 28, 2021

(86) PCT No.: PCT/JP2021/016937
§ 371 (c)(1),
(2) Date: Nov. 8, 2022

(87) PCT Pub. No.: WO2021/225102
PCT Pub. Date: Nov. 11, 2021

(65) Prior Publication Data
US 2023/0216463 A1 Jul. 6, 2023

(30) Foreign Application Priority Data
May 8, 2020 (JP) ................. 2020-082667

(51) Int. Cl.
*H03H 3/10* (2006.01)
(52) U.S. Cl.
CPC ..................... *H03H 3/10* (2013.01)
(58) Field of Classification Search
CPC ........ H03H 3/10; H03H 3/02; H03H 9/02559; H03H 9/02574; H03H 3/08; H10N 30/072; H10N 30/07
See application file for complete search history.

(56) References Cited

U.S. PATENT DOCUMENTS

| 5,374,564 A | 12/1994 | Bruel |
| 2008/0248629 A1* | 10/2008 | Yamazaki ........... H01L 21/3121 257/E21.703 |

(Continued)

FOREIGN PATENT DOCUMENTS

| JP | H05211128 A | 8/1993 |
| JP | 2010187373 A | 8/2010 |

(Continued)

OTHER PUBLICATIONS

"Communication with Supplementary European Search Report", EP Application No. 21799739.4, May 14, 2024, 7 pp.

(Continued)

*Primary Examiner* — Jeffrey T Carley
*Assistant Examiner* — Jose K Abraham
(74) *Attorney, Agent, or Firm* — Myers Bigel, P.A.

(57) ABSTRACT

Provided is a method of manufacturing a composite substrate equipped with a piezoelectric single-crystal film having good film-thickness uniformity and not causing deterioration in properties even if ion implantation is performed. The method of manufacturing a composite substrate 10 equipped with a piezoelectric single-crystal film 11 according to the present invention includes the steps of: (a) subjecting a piezoelectric single-crystal substrate 1 made of lithium tantalate or lithium niobate to ion implantation treatment to form an ion implantation layer 11, (c) bonding the surface of the piezoelectric single-crystal substrate 1 having the ion implantation layer 11 thereon to a temporary bonding substrate 2, (d) separating the piezoelectric single-crystal substrate 1 into the ion implantation layer 11 and the remaining portion of the substrate to form a piezoelectric single-crystal film 11 on the temporary bonding substrate 2, (f) bonding a supporting substrate 3 to the surface of the piezoelectric single-crystal film 11 opposite to a bonded (Continued)

surface of the temporary bonding substrate, and (g) separating the temporary bonding substrate from the piezoelectric single-crystal film 11.

5 Claims, 2 Drawing Sheets

(56) References Cited

U.S. PATENT DOCUMENTS

| | | | |
|---|---|---|---|
| 2010/0107388 A1* | 5/2010 | Iwamoto | H10N 30/2041 29/25.35 |
| 2010/0108248 A1* | 5/2010 | Hayakawa | H10N 30/072 156/247 |
| 2010/0182101 A1 | 7/2010 | Suzuki | |
| 2013/0285768 A1 | 10/2013 | Watanabe et al. | |
| 2014/0139075 A1* | 5/2014 | Iwamoto | H10N 30/877 29/25.35 |
| 2014/0191619 A1* | 7/2014 | Ito | H10N 30/073 216/13 |
| 2014/0210317 A1 | 7/2014 | Tai et al. | |
| 2014/0322546 A1 | 10/2014 | Akiyama et al. | |
| 2015/0008789 A1 | 1/2015 | Iwamoto | |
| 2015/0033521 A1 | 2/2015 | Watanabe et al. | |
| 2016/0329876 A1 | 11/2016 | Watanabe et al. | |
| 2017/0062698 A1 | 3/2017 | Ito et al. | |
| 2017/0331449 A1 | 11/2017 | Watanabe et al. | |
| 2018/0048282 A1 | 2/2018 | Kurimoto et al. | |
| 2018/0048283 A1 | 2/2018 | Tanno et al. | |
| 2019/0036007 A1 | 1/2019 | Kononchuk et al. | |
| 2019/0051525 A1* | 2/2019 | Akiyama | H10N 30/072 |
| 2019/0280666 A1 | 9/2019 | Akiyama et al. | |
| 2020/0052189 A1 | 2/2020 | Tanno et al. | |
| 2020/0058842 A1 | 2/2020 | Akiyama et al. | |
| 2020/0083859 A1 | 3/2020 | Watanabe et al. | |

FOREIGN PATENT DOCUMENTS

| | | |
|---|---|---|
| JP | 2017098577 A | 6/2017 |
| JP | 2019077607 A | 5/2019 |
| KR | 20180038369 A | 4/2018 |
| KR | 20180108603 A | 10/2018 |
| WO | WO-2009125844 A1 * 10/2009 ....... H01L 21/76254 |
| WO | 2012086639 A1 | 6/2012 |
| WO | 2012128268 A1 | 9/2012 |
| WO | 2013146374 A1 | 10/2013 |
| WO | 2018066653 A1 | 4/2018 |

OTHER PUBLICATIONS

"Communication with Supplementary European Search Report", EP Application No. 21800359.8, May 14, 2024, 8 pp.

"International Search Report and Written Opinion of the International Searching Authority with English language translation", International Application No. PCT/JP2021/016937, Jul. 20, 2021, 13 pp.

"International Search Report and Written Opinion of the International Searching Authority with English language translation", International Application No. PCT/JP2021/016935, Jul. 27, 2021, 13 pp.

Kawachi, Osamu, et al., "Analysis of Spurious Responses and Suppression Technic on Temperature Compensated SAW Devices Employing Bonded Water", The IEICE Transactions A, vol. J98-A, No. 9, Sep. 1, 2015, pp. 537-544 with English translation of Summary.

Liu, Weili, "Fabrication of single-crystalline LiTaO3 film on silicon substrate using thin film transfer technology", Journal of Vacuum Science & Technology B: Microelectronics and Nanometer Structures Processing, Measurement, and Phenomena, vol. 26, No. 1, Jan./Feb. 2008, pp. 206-208.

Taiyo Yuden Co., Ltd., "Temperature compensation technology for SAW-Duplexer used in RF front end of smartphone" with partial translation, Dempa Shimbun High Technology, Nov. 8, 2012, 10 pp.

Tauzin, A., et al., "3-inch single-crystal LiTaO3 films onto metallic electrode using Smart Cut(TM) technology", Electronics Letters, vol. 44, No. 13, Jun. 19, 2008, pp. 822-824.

Request for the Submission of an Opinion with English language translation, KR Application No. 10-2022-7038130, Jan. 10, 2025, 15 pp.

* cited by examiner

METHOD FOR MANUFACTURING COMPOSITE SUBSTRATE PROVIDED WITH PIEZOELECTRIC SINGLE CRYSTAL FILM

RELATED APPLICATIONS

This application is a 35 U.S.C. § 371 national stage application of PCT Application No. PCT/JP2021/016937, filed on Apr. 28, 2021, which claims priority from Japanese Patent Application No. 2020-082667, filed on May 8, 2020, the contents of which are incorporated herein by reference in their entireties. The above-referenced PCT International Application was published in the Japanese language as International Publication No. WO 2021/225102 A1 on Nov. 11, 2021.

TECHNICAL FIELD

The present invention relates to a method of manufacturing a composite substrate for surface acoustic wave devices, the composite substrate being equipped with a piezoelectric single-crystal film such as a lithium tantalate single crystal.

BACKGROUND ART

As a component for frequency adjustment/selection of cellular phones and the like, a surface acoustic wave (SAW) device having, on the piezoelectric substrate thereof, an interdigital transducer (IDT) for exciting surface acoustic waves has been used.

The surface acoustic wave device is required to be compact, have small insertion loss, and have ability to stop the passage of spurious waves through the device, so that for it, piezoelectric materials such as lithium tantalate ($LiTaO_3$; abbreviated as LT) and lithium niobate ($LiNbO_3$; abbreviated as LN) are used.

According to the communication standards for cellular phones of the fourth and subsequent generations, on the other hand, the frequency band interval is narrow and the band width is wide in transmission and reception. Under such communication standards, a piezoelectric material used for surface acoustic wave devices is required to have temperature-dependent property variation as small as possible.

In manufacturing a SAW device, variation in the thickness of a piezoelectric material leads to variation in SAW velocity, so the film thickness should be controlled with high precision.

It is reported in Non-Patent Document 1 or Non-Patent Document 2 that a substrate obtained by bonding an LT substrate to a sapphire substrate or silicon substrate having a linear expansion coefficient smaller than that of the LT substrate and grinding the LT substrate into a thin film has suppressed influence of thermal expansion of an oxide single-crystal and thereby has improved temperature properties.

Patent Document 1 describes a method of manufacturing a surface acoustic wave device including implanting ions in a piezoelectric substrate from one direction thereof and while heating the piezoelectric substrate, separating the piezoelectric substrate into a piezoelectric film and a remaining piezoelectric substrate portion at a high-concentration ion implanted portion of the piezoelectric substrate into which ions are implanted at the highest concentration, thereby leaving the piezoelectric film on the side of a supporting substrate.

REFERENCE DOCUMENT LIST

Patent Document

Patent Document 1: International Publication No. 2012/086639

Non-Patent Documents

Non-Patent Document 1: Transactions of The Institute of Electronics, Information and Communication Engineers A Vol. J98-A, No. 9, pp. 537-544

Non-Patent Document 2: Taiyo Yuden Co., Ltd., "Temperature compensation technology for SAW-Duplexer used in RF front end of smartphone." [online], Nov. 8, 2012, Dempa Shimbun High Technology, searched on March 20, Heisei 27, internet <URL: http://www.yuden.co.jp/jp/product/tech/column/20121108.html>

SUMMARY OF THE INVENTION

Problem to be Solved by the Invention

The method of manufacturing a composite substrate including grinding of a LT substrate, which is described in Non-Patent Document 1 or Non-Patent Document 2, has a problem in that deterioration in film-thickness uniformity occurs with thinning of a piezoelectric substrate.

The method described in Patent Document 1 for obtaining a piezoelectric film by ion implantation can provide a piezoelectric film excellent in film-thickness uniformity, but it has a drawback that the piezoelectric film thus obtained has deteriorated properties. As a result of the study by the present inventor on the cause of deteriorated properties, it has been found that by the ion implantation, $H^+$ ions pass in the LT substrate and thereby cause transfer of $Li^+$ ions in the ion implantation layer, leading to non-uniformity in piezoelectricity in the ion implantation layer. It has also been found that transfer and precipitation of some $Li^+$ ions up to the ion implantation surface of the ion implantation layer causes a decrease in Li content at the separation interface (exposed surface of the piezoelectric film) at which the hydrogen ion concentration is particularly high in the ion implantation layer.

The present inventor investigated removal, by polishing, of the exposed surface of the piezoelectric film showing deterioration in properties, but a decrease in Li content occurred not only in the exposed surface of the piezoelectric film, but even in a portion of the piezoelectric film 30% or more of the total thickness from the exposed surface. This portion should therefore be removed by polishing. This, however, leads to a problem in that it impairs the film-thickness uniformity, depending on the polishing amount, and at the same time, prevents full recovery of piezoelectricity.

In view of the aforesaid problems, an object of the invention is therefore to provide a method of manufacturing a composite substrate equipped with a piezoelectric single-crystal film having good film-thickness uniformity and not causing deterioration in properties even if ion implantation is performed.

Means for Solving the Problem

With a view to achieving the aforesaid object, provided by the present invention is a method of manufacturing a composite substrate equipped with a piezoelectric single-crystal film, including a step of performing ion implantation treatment into one of the surfaces of a piezoelectric single-crystal substrate composed of lithium tantalate or lithium niobate to form an ion implantation layer in the piezoelectric single-crystal substrate, in which the ion implantation treatment is carried out with ion species containing at least one of a hydrogen atom ion ($H^+$) and a hydrogen molecule ion ($H_2^+$) in an ion implantation dose of $1.0 \times 10^{16}$ atoms/cm$^2$ or more and $3.0 \times 10^{17}$ atoms/cm$^2$ or less in terms of a hydrogen atom ion ($H^+$); a step of bonding the surface of the piezoelectric single-crystal substrate having the ion implantation layer formed thereon and a temporary bonding substrate; a step of separating the piezoelectric single-crystal substrate into the ion implantation layer and the remaining portion of the substrate, and forming a piezoelectric single-crystal film having a thickness of 2 μm or less on the temporary bonding substrate; a step of bonding a supporting substrate to a surface of the piezoelectric single-crystal film opposite to a bonded surface of the temporary bonding substrate; and a step of separating a portion or the whole of the temporary bonding substrate from the piezoelectric single-crystal film.

The aforesaid temporary bonding substrate may be a single-crystal silicon substrate. In this case, the method of manufacturing a composite substrate according to the present invention may further include a step of performing ion implantation treatment into the bonded surface of the temporary bonding substrate to the piezoelectric single-crystal substrate and thereby forming an ion implantation layer in the temporary bonding substrate. Separation of a portion of the temporary bonding substrate from the piezoelectric single-crystal film may be achieved by separation of the temporary bonding substrate into the ion implantation layer of the temporary bonding substrate and the remaining portion thereof and a single-crystal silicon film having a thickness of 2 μm or less may be formed on the piezoelectric single-crystal film.

When the temporary bonding substrate is subjected to ion implantation treatment, the ion species contain at least one of a hydrogen atom ion ($H^+$) and a hydrogen molecule ion ($H_2^+$) and the ion implantation dose is $1.0 \times 10^{16}$ atoms/cm$^2$ or more and $2.0 \times 10^{17}$ atoms/cm$^2$ or less in terms of a hydrogen atom ion ($H^+$). The ion implantation dose into the temporary bonding substrate may be adjusted to be smaller than that into the piezoelectric single-crystal substrate.

The separation of the temporary bonding substrate into the ion implantation layer of the temporary bonding substrate and a remaining portion thereof may be conducted by at least one selected from the group consisting of heat treatment, mechanical impact, jetting, ultrasonic vibration, and photo irradiation.

The material of the supporting substrate may be selected from the group consisting of glass, silicon, quartz, sapphire, spinel, silicon carbide, silicon nitride, and aluminum nitride.

The separation into the ion implantation layer of the piezoelectric single-crystal substrate and the remaining portion thereof may be achieved by at least one selected from the group consisting of heat treatment, mechanical impact, jetting, ultrasonic vibration, and photo irradiation.

When the entirety of the temporary bonding substrate is separated from the piezoelectric single-crystal film, it may be performed by at least one selected from the group consisting of mechanical processing, jetting, ultrasonic vibration, photo irradiation, and immersion in chemical solution.

Effects of the Invention

Thus, according to the present invention, by bonding the surface of the piezoelectric single-crystal substrate having the ion implantation layer thereon to the temporary bonding substrate, separating the piezoelectric single-crystal substrate into the ion implantation layer and the remaining portion of the substrate to form an ion implantation layer (piezoelectric single-crystal film) having a predetermined thickness on the temporary bonding substrate, bonding a supporting substrate to the exposed surface of the resulting piezoelectric single-crystal film, and separating a portion or the whole of the temporary bonding substrate from the piezoelectric single-crystal film, the supporting substrate having the piezoelectric single-crystal film thereon can be obtained without polishing the piezoelectric single-crystal substrate in a large amount. Thus, the composite substrate equipped with a piezoelectric single-crystal film with improved film-thickness uniformity can be manufactured and in addition, it is not affected by deterioration in properties because the separated interface of the ion implantation layer showing a marked decrease in Li content is bonded to the supporting substrate and the ion implanted surface of the ion implantation layer showing no decrease in Li content is placed on the surface on the side opposite to the supporting substrate.

MODE FOR CARRYING OUT THE INVENTION

One embodiment of the method of manufacturing a composite substrate equipped with a piezoelectric single-crystal film according to the present invention will hereinafter be described with reference to the attached drawings, but the scope of the present invention is not limited to, or by it.

Figure 1:
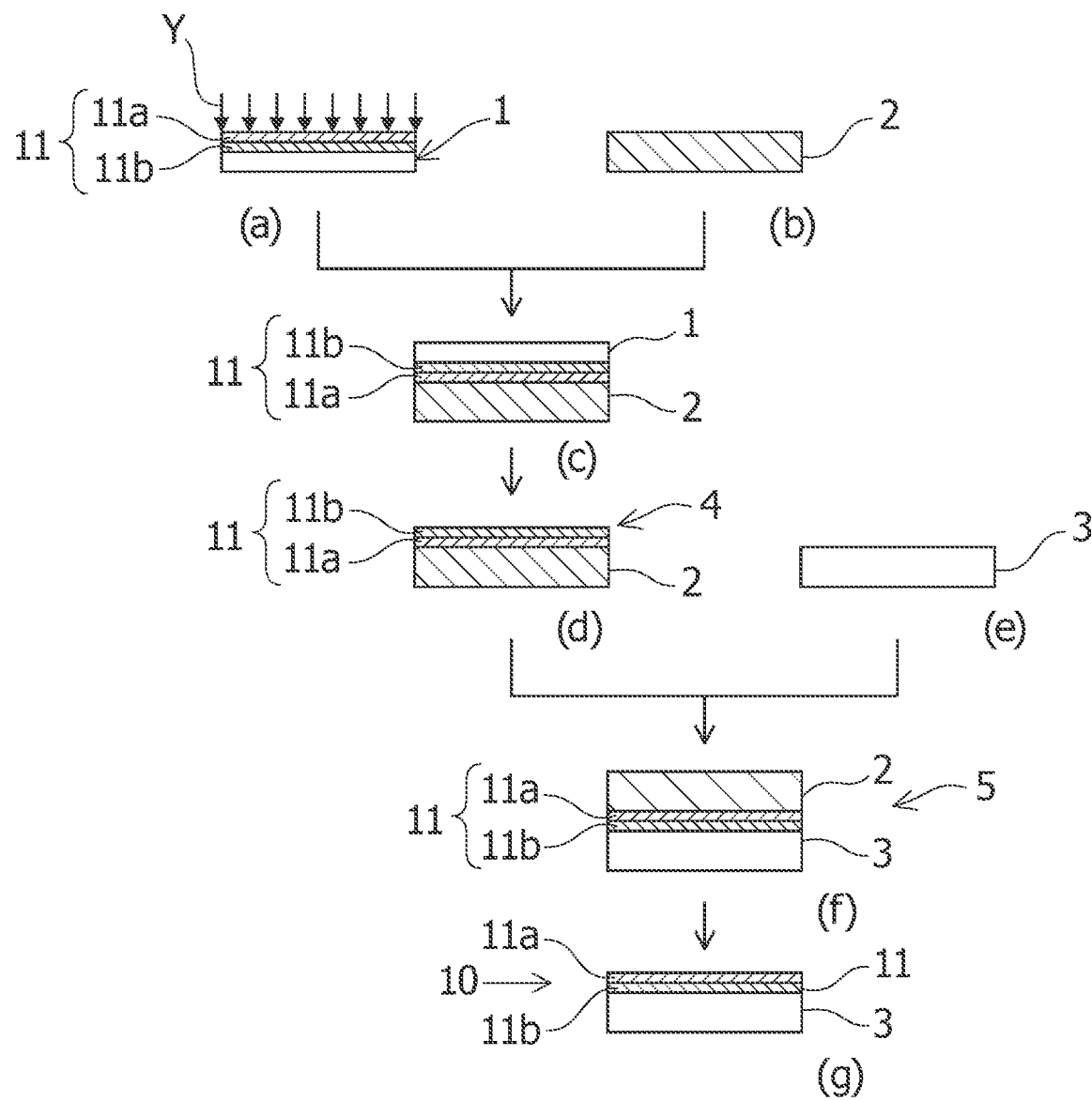
FIG. 1 is a schematic flow chart for explaining one embodiment of the method of manufacturing a composite substrate equipped with a piezoelectric single-crystal film according to the present invention.

The method of manufacturing a composite substrate equipped with a piezoelectric single-crystal film according to the present embodiment includes, as shown in FIG. 1, a step of subjecting a piezoelectric single-crystal substrate 1 to ion implantation treatment to form an ion implantation layer 11 in the piezoelectric single-crystal substrate 1 ((a) in FIG. 1), a step of preparing a temporary bonding substrate 2 ((b) in FIG. 1), a step of bonding the temporary bonding substrate 2 to the surface of the piezoelectric single-crystal substrate 1 on the side of the ion implantation layer 11 ((c) in FIG. 1), a step of leaving the ion implantation layer 11 on the temporary bonding substrate 2 and separating the remaining portion of the piezoelectric single-crystal substrate 1 ((d) in FIG. 1), a step of preparing a supporting substrate 3 ((e) in FIG. 1), a step of bonding the supporting substrate 3 to the exposed surface of the ion implantation layer 11 ((f) in FIG. 1), and a step of separating the temporary bonding substrate 2 from the ion implantation layer 11 to obtain a composite substrate 10 having, on the supporting substrate 3, the ion implantation layer 11 as a piezoelectric single-crystal film ((g) in FIG. 1). Each of these steps will hereinafter be described in detail.

The piezoelectric single-crystal substrate 1 to be prepared in the step (a) is made of lithium tantalate ($LiTaO_3$; abbreviated as LT) or lithium niobate ($LiNbO_3$; abbreviated as LN). The piezoelectric single-crystal substrate 1 may be used in the form of a wafer. The size of the wafer is not particularly limited and it may have, for example, a diameter of 2 to 12 inches and a plate thickness of 100 to 1000 μm. As the piezoelectric single-crystal substrate 1, one commercially available in the form of a wafer or one obtained by processing a piezoelectric single-crystal ingot into the form of a wafer by slicing or the like may be used.

In the step (a), the surface of the piezoelectric single-crystal substrate 1 to be laminated is subjected to ion implantation treatment Y. By this treatment, an ion implantation layer 11 is formed on the surface of the piezoelectric single-crystal substrate 1 to be laminated. As ion species of the ion implantation treatment Y, either one or both of a hydrogen atom ion ($H^+$) and a hydrogen molecule ion ($H_2^+$) may be used. An ion implantation dose is $1.0 \times 10^{16}$ atoms/$cm^2$ or more and $3.0 \times 10^{17}$ atoms/$cm^2$ or less in terms of a hydrogen atom ion ($H^+$). The dose less than $1.0 \times 10^{16}$ atom/$cm^2$ is unlikely to cause embrittlement of the ion implantation layer in a subsequent step. When the dose exceeds $3.0 \times 10^{17}$ atom/$cm^2$, microcavities form in the ion implanted surface during ion implantation and irregularities are formed on the wafer surface, making it difficult to achieve a desired surface roughness. The ion implantation dose is more preferably $2.5 \times 10^{16}$ atoms/$cm^2$ or more and $1.5 \times 10^{17}$ atoms/$cm^2$ or less.

The ion accelerating voltage is preferably 50 KeV or more and 200 KeV or less. The ion implantation depth can be changed by adjusting the accelerating voltage. The thickness of the ion implantation layer 11 substantially corresponds to the thickness of the piezoelectric single-crystal film of the composite substrate 10 thus obtained.

By such ion implantation treatment, the ion implantation layer 11 is formed on the laminated surface of the piezoelectric single-crystal substrate 1. By the ion implantation, $H^+$ ions pass in the piezoelectric single-crystal substrate 1 and thereby cause transfer of $Li^+$ ions in the ion implantation layer 11. As a result, although it barely causes a decrease in Li content in the surface portion 11a on the side of the ion implanted surface, a decrease in Li content is observed in the deep portion 11b having a high ion concentration.

The Li concentration of the piezoelectric single-crystal substrate 1 made of LT or LN can be measured by a known method and can be evaluated, for example, by Raman spectroscopy. The LT substrate is known to have an approximately linear relationship between the half-value width of Raman shift peak and Li concentration (Li/(Li+Ta) value). Using an expression representing such a relationship makes it possible to evaluate the composition of the piezoelectric single-crystal substrate at any position thereof.

The rational expression showing the relationship between the half-value width of Raman shift peak and the Li concentration can be obtained by measuring the Raman half-value width of some samples having a known composition and differing in Li concentration. Under the same Raman measurement conditions, the rational expression already disclosed in the documents may be used. For example, the following Numerical expression 1 may be used for lithium tantalate single crystals (refer to 2012 IEEE International Ultrasonics Symposium Proceedings, Page(s): 1252-1255).

$$Li/(Li+Ta)=(53.15-0.5FWHM1)/100 \quad \text{(Numerical expression 1)}$$

In the expression, "FWHM1" is a half-value width of the Raman shift peak around 600 $cm^{-1}$. For details of the measurement conditions, refer to the aforesaid document.

As the temporary bonding substrate 2 to be prepared in the step (b), for example, a single-crystal silicon substrate, a quartz substrate, or a sapphire substrate may be used. Of these, the single-crystal silicon substrate is more preferred for the following reasons. Since the temporary bonding substrate 2 is removed in the end, a material excellent in processability is suitable. The single-crystal silicon substrate can easily be thinned by ion implantation or removed chemically or physically by polishing, etching, or the like. In addition, a LT substrate generally has a resistivity of $10^{10}$ Ω·cm or more, while the single-crystal substrate, even if it is a high resistance product, has a relatively low resistivity less than $2 \times 10^5$ Ω·cm. The piezoelectricity of the bonded body of the LT substrate and the single-crystal silicon substrate can therefore be recovered by voltage application (repolarization treatment). The temporary bonding substrate 2 may be used in the form of a wafer. The wafer size is preferably 2 to 12 inches in diameter and 100 to 2000 μm in plate thickness.

The surface of the piezoelectric single-crystal substrate 1 to be laminated, the surface of the temporary bonding substrate 2 to be laminated, and the surface of the supporting substrate 3 to be laminated (which will be described specifically later) are each preferably processed into a mirror surface by lapping polishing or the like. The surface roughness RMS of the surface to be laminated is preferably 1.0 nm or less. By adjusting RMS to 1.0 nm or less, these substrates may be bonded by lamination. The term "RMS" is also called "root mean square roughness Rq" as specified by JIS B 0601:2013.

Next, as shown in the step (c) in FIG. 1, the surface of the piezoelectric single-crystal substrate 1 to be laminated and the surface of the temporary bonding substrate 2 to be laminated are bonded to each other. The bonding method in this step (c) is not particularly limited and for example a direct bonding method such as room-temperature bonding method, diffusion bonding method, plasma bonding method, or surface activation bonding method may be used, or they may be bonded via an adhesive or the like. Of these bonding methods, a room-temperature bonding method is particularly preferred in order to prevent occurrence of exfoliation or defects which will otherwise be caused by large differences in thermal expansion coefficient between the piezoelectric single-crystal substrate 1 such as LT substrate or LN substrate and the temporary bonding substrate 2 such as single-crystal silicon substrate. For the bonding with an adhesive, for example, a UV curing acrylic adhesive or an adhesive composed mainly of a thermosetting modified silicone may be used.

In the room-temperature bonding method, one or both of the surfaces of the piezoelectric single-crystal substrate 1 and the temporary bonding substrate 2 to be laminated are subjected to surface activation treatment prior to bonding. The surface activation treatment is not particularly limited as long as it allows bonding of the surfaces to be laminated at normal temperature, and examples include beam irradiation treatment, ozone water treatment, and UV ozone treatment. Examples of the beam source for the beam irradiation treatment include ion beam obtained by ionizing an inert gas such as argon into a beam and a fast atom beam using an argon atom as a beam. The beam irradiation treatment is preferably performed in an atmosphere, for example, a vacuum atmosphere, particularly preferably a high vacuum atmosphere.

Then, as shown in the step (d) of FIG. 1, while leaving the ion implantation layer 11 on the temporary bonding substrate 2, the remaining portion of the piezoelectric single-crystal substrate 1 is separated. By this separation, a first composite 4 having the ion implantation layer (piezoelectric single-crystal film) 11 formed on the temporary bonding substrate 2 can be obtained. In this first composite 4, a surface portion 11a of the ion implantation layer 11 showing no decrease in Li content is bonded to the temporary bonding substrate 2 and a deep portion 11b showing a decrease in Li content is exposed.

As a method of separating the piezoelectric single-crystal substrate 1 into the ion implantation layer 11 and the remaining portion of the substrate, for example, heat treatment, mechanical impact, jetting, ultrasonic vibration, and photo irradiation may be used either singly or in combination of two or more.

For the separation by heat treatment, the first composite 4 is preferably heated at 100° C. or more and 200° C. or less to generate, in the ion implantation layer, minute air bubbles from the implanted hydrogen ions. The heating time is preferably 50 minutes or more and 100 hours or less. By such heat treatment, the piezoelectric single-crystal substrate 1 can be separated into the ion implantation layer 11 and the remaining portion of the substrate.

For the separation by mechanical impact, for example, a tool such as wedge-shaped blade (not shown in the drawing) is used. Examples of the material of such a tool include plastics (such as polyether ether ketone), metals, zirconia, silicon, and diamond. As the shape, the tool may have an acute-angle shape. The separation by mechanical impact is achieved, for example, by bringing a tool into contact with the end portion of the ion implantation layer 11 and giving an impact thereto from the side surface of the first composite 4 to cause gradual cleavage toward the end portion on the side opposite to the aforesaid one. Thus, the piezoelectric single-crystal substrate 1 can be released into the ion implantation layer 11 and the remaining portion of the substrate.

For the separation by jetting, for example, a fluid jet such as an air jet or a liquid jet may be used. As the fluid jet such as an air jet or a liquid jet, use of high-pressure air or high-pressure water having a flow rate of about 10 to 1000 L/min is preferred. The separation by jetting is achieved, for example, by continuously or intermittently spraying the fluid to the end portion of the ion implantation layer 11 from the side surface of the first composite 4, thereby releasing the piezoelectric single-crystal substrate 1 into the ion implantation layer 11 and the remaining portion of the substrate.

For separation by ultrasonic vibration, for example, an ultrasonically vibrating tool such as ultrasonic cutter or a water tank equipped with an ultrasonic vibrator, such as ultrasonic cleaner, may be used. The ultrasonically vibrating tool has a wedge-shaped blade capable of applying ultrasonic waves by a vibrator. By bringing the blade into contact with the end portion of the ion implantation layer 11 from the side surface of the first composite 4, the ion implantation layer 11 can be embrittled and the piezoelectric single-crystal substrate 1 can be separated into the ion implantation layer 11 and the remaining portion of the substrate. In this case, the frequency of the ultrasonic waves is not particularly limited and for example, 20 to 40 kHz is preferred. When the water tank equipped with an ultrasonic vibrator is used, the first composite 4 is immersed in the water tank and ultrasonic vibration is applied to the ion implantation layer 11 via the liquid to embrittle the ion implantation layer 11 and thereby separate the piezoelectric single-crystal substrate 1 into the ion implantation layer 11 and the remaining portion of the substrate. The frequency of the ultrasonic waves in this case is not particularly limited and, for example, 26 kHz to 1.6 MHz is preferred. The immersion time in the water tank is preferably, for example, 1 to 60 minutes.

For the separation by photo irradiation, for example, irradiation with visible light is preferred. The ion implantation layer can be embrittled and separated through such a mechanism that the vicinity of the ion implantation interface formed inside the piezoelectric single-crystal substrate 1, which has been made amorphous, easily absorbs visible light and accepts energy selectively. The light source of the visible light is, for example, preferably a Rapid Thermal Annealer (RTA), a green laser light, or a flash lamp light.

After the piezoelectric single-crystal substrate 1 is separated into the ion implantation layer (piezoelectric single-crystal film) 11 and the remaining portion of the substrate as described above, the piezoelectric single-crystal film 11 on the temporary bonding substrate 2 may be subjected to repolarization treatment, if necessary. The repolarization treatment may be performed by applying a voltage to the first composite 4. Alternatively, known repolarization treatment may be performed.

The supporting substrate 3 to be prepared in the step (e) will be a supporting substrate of the composite substrate 10 obtained in the end and, for example, a substrate made of a material selected from the group consisting of glass, silicon, quartz, sapphire, spinel, silicon carbide, silicon nitride, and aluminum nitride is preferably used. The temporary bonding substrate 2 may be used in the form of a wafer. As the size, the wafer has preferably a diameter of 2 to 12 inches. The surface of the supporting substrate 3 to be laminated is preferably a mirror surface obtained by processing such as lapping polishing as described above.

In addition, the exposed surface of the ion implantation layer 11 of the first composite 4 is preferably adjusted to have a surface roughness RMS of 1.0 nm or less by processing such as lapping polishing. By this polishing, the thickness of the ion implantation layer (piezoelectric single-crystal film) 11 can be adjusted.

Then, as shown in the step (f) of FIG. 1, the supporting substrate 3 is laminated and bonded to the exposed surface of the piezoelectric single-crystal film 11 of the first composite 4 to obtain a second composite 5 having the temporary bonding substrate 2, the piezoelectric single-crystal film 11, and the supporting substrate 3 stacked in the listed order of.

The first composite 4 and the supporting substrate 3 are bonded to each other, for example, by a direct bonding method such as room-temperature bonding method, diffusion bonding method, plasma bonding method, or surface activation bonding method, depending on the material of the supporting substrate 3. When there is a large difference in expansion coefficient between the piezoelectric single-crystal film 11 such as LT or LN and the supporting substrate 3, a room-temperature bonding method is preferred in order to suppress occurrence of exfoliation or defects. In the room temperature bonding method, as in the aforesaid step (c), one or both of the exposed surface of the piezoelectric single-crystal film 11 of the first composite 4 and the surface of the supporting substrate 3 to be laminated are subjected to surface activation treatment. As the surface activation treatment, as in the aforesaid step (c), for example, beam irradiation treatment is performed.

Then, as shown in the step (g) of FIG. 1, the temporary bonding substrate 2 is separated from the piezoelectric single-crystal film 11 of the second composite 5 to expose the piezoelectric single-crystal film 11, and thus, a composite substrate 10 having the piezoelectric single-crystal film 11 on the supporting substrate 3 can be obtained. As the separation method usable here, for example, mechanical processing, jetting, ultrasonic vibration, photo irradiation, and immersion in chemical solution may be used either singly or in combination of two or more.

For the separation by mechanical processing, for example, one or both of grinding and polishing are performed. For grinding, the exposed surface of the temporary bonding substrate 2 is ground, for example, with whetstones of various numbers. For polishing, the exposed surface of the temporary bonding substrate 2 is polished, for example, with a slurry containing cerium oxide particles or colloidal silica (such polishing may also be called "lapping polishing"). The temporary bonding substrate 2 can be removed from the piezoelectric single-crystal film 11 by this processing.

For the separation by jetting, for example, a fluid jet such as an air jet or a liquid jet may be used. As the fluid jet such as an air jet or a liquid jet, use of high-pressure air or high-pressure water having a flow rate of about 10 to 1000 L/min is preferred. The separation by jetting is achieved, for example, by continuously or intermittently spraying the fluid to the end portion of the temporary bonding substrate 2 from the side surface of the second composite 5, thereby separating the temporary bonding substrate 2 from the piezoelectric single-crystal film 11.

For the separation by ultrasonic vibration, for example, an ultrasonically vibrating tool such as ultrasonic cutter or a water tank equipped with an ultrasonic vibrator such as ultrasonic cleaner may be used. The ultrasonically vibrating tool has a wedge-shaped blade capable of applying ultrasonic waves by a vibrator. By bringing the blade into contact with the end portion of the temporary bonding substrate 2 from the side surface of the second composite 5, the temporary bonding substrate 2 can be separated from the piezoelectric single-crystal film 11. In this case, the frequency of the ultrasonic waves is not particularly limited and for example, 20 to 40 kHz is preferred. In the water tank equipped with an ultrasonic vibrator, the second composite 5 is immersed in the water tank and ultrasonic vibration is applied via the liquid, and thus, the temporary bonding substrate 2 can be separated from the piezoelectric single-crystal film 11. The frequency of the ultrasonic waves in this case is not particularly limited and, for example, 26 kHz to 1.6 MHz is preferred. The immersion time in the water tank is preferably, for example, 1 to 60 minutes.

For the separation by photo irradiation, for example, irradiation with visible light is preferred. The separation can be achieved through a mechanism such that the vicinity of the interface between the temporary bonding substrate 2 and the piezoelectric single-crystal film 11 which has been made amorphous easily absorbs visible light and accepts energy selectively. The light source of the visible light is, for example, preferably a Rapid Thermal Annealer (RTA), a green laser light, or a flash lamp light.

When bonding is carried out with an adhesive, the separation can be achieved by immersion in a chemical solution. As the chemical solution, for example, hydrocarbon-based solvents such as p-menthane and polar solvents such as N-methyl pyrrolidone, dimethylformamide, and dimethyl sulfoxide may preferably be used, although this depends on the type of curing of the adhesive used. The immersion time is preferably 1 to 10 minutes, and more preferably 3 to 5 minutes.

After the separation, the exposed surface of the piezoelectric single-crystal film 11 may be subjected to SC-1 cleaning (cleaning with a mixture of aqueous ammonia, hydrogen peroxide water, and pure water) if necessary, by which the residue of the temporary bonding substrate 2, such as silicon, which has remained on the exposed surface of the piezoelectric single-crystal film 11 can be oxidized, etched, and removed.

In the composite substrate 10 thus obtained and having the piezoelectric single-crystal film 11 on the supporting substrate 3, the deep portion 11b of the piezoelectric single-crystal film 11 showing a decrease in Li content is bonded to the supporting substrate 3 and the surface portion 11a of the piezoelectric single-crystal film free from a decrease in Li content is exposed. Since the surface portion 11a of the piezoelectric single-crystal film 11, which is free from a decrease in Li content, is on the side of the exposed surface of the composite substrate 10 even if the piezoelectric single-crystal film 11 has therein a portion showing a decrease in Li content, deterioration in properties of the film as a piezoelectric body can be suppressed. In addition, the piezoelectric single-crystal film 11 is formed on the supporting substrate 3 without polishing a large amount of the ion implantation layer 11 of the piezoelectric single-crystal substrate 1 so that it has good film-thickness uniformity.

The method of manufacturing a composite substrate equipped with a piezoelectric single-crystal film according to the present embodiment has been described with reference to FIG. 1, but the present invention is not limited to, or by, this. It may include many modifications such as change in the order of some of the aforesaid steps or incorporation of another new step. For example, when a single-crystal silicon substrate is used as the temporary bonding substrate 2, a step of subjecting the surface of the temporary bonding substrate 2 to be laminated to ion implantation treatment and thereby forming an ion implantation layer prior to bonding of the temporary bonding substrate 2 to the piezoelectric single-crystal substrate 1. By forming an ion implantation layer on the temporary bonding substrate 2 made of single-crystal silicon as described above, it is possible, in the step (g) of separating the temporary bonding substrate 2, to leave the ion implantation layer of the temporary bonding substrate 2 on the piezoelectric single-crystal film 11 of the second composite 5 and separate the remaining portion of the temporary bonding substrate 2 from the second composite 5 by using heat treatment, mechanical impact, jetting, ultrasonic vibration, and photo irradiation similar to that used in the step (d), either alone or in combination of two or more.

The ion implantation treatment into the temporary bonding substrate 2 may be performed with one or both of a hydrogen atom ion ($H^+$) and a hydrogen molecule ion ($H_2^+$) as ion species. The ion implantation dose is preferably $1.0 \times 10^{16}$ atoms/cm$^2$ or more and $2.0 \times 10^{17}$ atoms/cm$^2$ or less in terms of a hydrogen atom ion ($H^+$).

When the temporary bonding substrate 2 is separated in such a manner, the ion implantation layer of the temporary bonding substrate 2 remains on the piezoelectric single-crystal film 11. The ion implantation layer of the temporary bonding substrate 2 may be removed therefrom or left thereon. The removal may be achieved by carrying out SC-1 cleaning, and thereby oxidizing, etching, and removing the ion implantation layer from the temporary bonding substrate 2. On the other hand, the ion implantation layer of the temporary bonding substrate 2 may be left as a single-crystal silicon film, depending on the intended use of the composite substrate 10. In this case, the composite substrate thus obtained may be a composite substrate having the supporting substrate, the piezoelectric single-crystal film, and the single-crystal silicon film stacked in the order listed.

EXAMPLES

Examples and Comparative Example will hereinafter be described but the present invention is not limited to, or by, them.

Example 1

As a piezoelectric single-crystal substrate, a temporary bonding substrate, and a supporting substrate, a 42° Rotated Y-cut LiTaO$_3$ substrate (congruent composition: Li content 48.5%) having a thickness of 400 μm and a single-sided mirror surface, a single-crystal silicon substrate having a thickness of 400 μm and a single-sided mirror surface, and a sapphire substrate having a thickness of 400 μm and a single-sided mirror surface were prepared, respectively. Those three substrates were confirmed to have mirror-surface-side surface roughness RMS of 1.0 nm or less. Then, the LT substrate on the mirror surface side was subjected to ion implantation treatment under the conditions of a hydrogen ion (H$^+$) dose of 1×10$^{17}$ atoms/cm$^2$ and an accelerating voltage of 160 KeV to form an ion implantation layer.

Next, the LT substrate and the single-crystal silicon substrate were bonded to each other by the room-temperature bonding method described in Non-Patent Document "Takagi H. et al., "Room-temperature wafer bonding using argon beam activation" From Proceedings-Electrochemical Society (2001), 99-35 (Semiconductor Wafer Bonding: Science, Technology, and Applications V), 265-274" to obtain a bonded substrate. More specifically, after the mirror surfaces of cleaned substrates placed in a high-vacuum chamber were irradiated with an argon high-speed atom beam, that is, a neutralized ion beam and subjected to activation treatment, the LT substrate and the silicon substrate were bonded to each other at their mirror surfaces subjected to activation treatment. The resulting bonded substrate was heated to 120° C., and while leaving the ion implantation layer of the LT substrate on the silicon substrate side, the remaining portion of the LT substrate was released from the bonded substrate. As a result, a LT-on-silicon first composite having, on the silicon substrate thereof, a LT film (piezoelectric single-crystal film) thinned to 900 nm thickness was manufactured.

Then, after application of a voltage to the resulting first composite at 650° C. and 300 V to cause repolarization, the exposed surface of the LT film was polished to remove a 30-nm thick portion from the surface and adjust the surface roughness RMS to 1.0 nm or less. The resulting composite was bonded to the sapphire substrate prepared as the supporting substrate by the room-temperature bonding method to obtain a sapphire/LT/single-crystal silicon second composite. The single-crystal silicon substrate portion of the second composite was removed by grinding and polishing and SC-1 cleaning to manufacture a LT-on-sapphire composite substrate.

The half-value width (FWHM1) of Raman shift peak in the vicinity of 600 cm$^{-1}$, serving as the index of a Li content, of the LT-on-sapphire composite substrate thus obtained was measured using a Laser Raman spectrometer (product of HORIBA Scientific, LabRam HR series, He—Ne ion laser, spot size: 1 μm, room temperature) and a Li concentration was calculated from the half-value width in accordance with the aforesaid Numerical expression 1. As a result, the Li content in the exposed surface of the LT film (the ion implanted surface of the initial LT substrate) was 48.5%. It was confirmed that the LT substrate showed no decrease in Li content from that of the initial LT substrate.

Example 2

In a manner similar to that of Example 1 except that ion implantation treatment with hydrogen ions (H$^+$) was performed also on the mirror surface side of the single-crystal silicon substrate under the conditions of a dose of 1.25×10$^{17}$ atoms/cm$^2$, and an accelerating voltage of 130 KeV, an LT substrate and a single-crystal silicon substrate were prepared, ion implantation treatment was performed, and then the LT substrate and the silicon substrate were bonded by the room-temperature bonding method to obtain a bonded substrate. The resulting bonded substrate was heated as in Example 1 to leave the ion implantation layer of the LT substrate on the side of the single-crystal silicon substrate and release the remaining portion of the LT substrate from the bonded substrate to manufacture a LT-on-silicon first composite having a LT film, which had been thinned to a 900-nm thickness, remained on the single-crystal silicon substrate.

Then, after application of a voltage to the resulting LT-on-silicon composite substrate under the conditions of 200° C. and 300 V to cause repolarization, the exposed surface of the LT film was polished to remove a 30-nm thick portion from the surface and adjust the surface roughness RMS to 1.0 nm or less. The resulting composite substrate and a sapphire substrate were then bonded by the room-temperature bonding method as in Example 1 to obtain a sapphire/LT/silicon second composite. The resulting second composite was heated at 300° C. to leave the ion implantation layer of the single-crystal silicon substrate on the side of the LT film and release the remaining portion of the single-crystal silicon substrate from the second composite. Then, the silicon remaining film having a thickness of 300 nm which had remained on the LT film was removed by SC-1 cleaning to obtain a LT-on-sapphire composite substrate.

As a result of measurement of the Li content of the LT film of the resulting LT-on-sapphire composite substrate by using a laser Raman spectrometer as in Example 1, the Li content in the exposed surface (ion-implanted surface of the initial LT substrate) of the LT film was 48.5%, from which it was confirmed that the Li content showed no decrease from that of the initial LT substrate.

Comparative Example

An LT substrate and a silicon substrate similar to those of Example 1 were prepared. Ion implantation treatment with hydrogen ions (H$^+$) was given to the LT substrate on the mirror surface side under the conditions of a dose of 1×10$^{17}$ atoms/cm$^2$ and an accelerating voltage of 160 KeV and the resulting LT substrate and the silicon substrate were bonded to each other by the room-temperature bonding method. The resulting bonded substrate was heated to 120° C. and the LT substrate was separated therefrom along the ion implantation layer to manufacture a LT-on-silicon composite substrate having a LT film thinned to 900 nm-thickness left on the silicon substrate.

Figure 2:
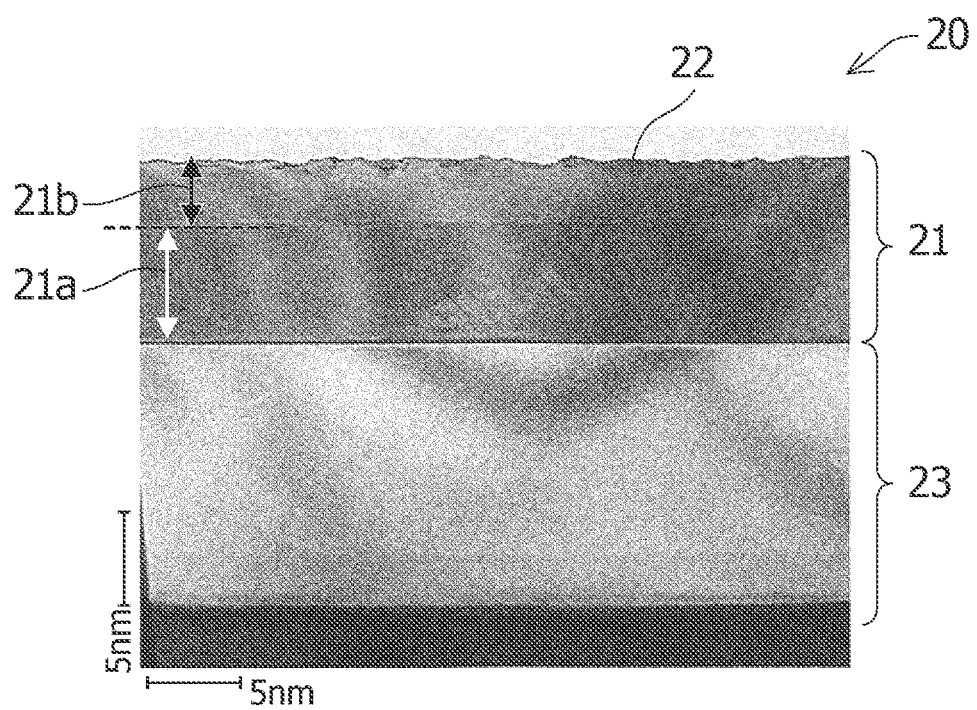
FIG. 2 is a TEM image showing the cross-section of a composite substrate of Comparative Example.

The cross-section of the LT-on-silicon composite substrate thus obtained was observed using a transmission electron microscope (TEM). The TEM image as the observation result is shown in FIG. 2. In addition, the Li content of the LT film of the LT-on-silicon composite substrate was measured as in Example 1 by a laser Raman spectrometer.

The result will next be described referring to the TEM image shown in FIG. 2. The Li content in an exposed surface 22 (separated interface of the ion implantation layer) of a LT film 21 on a supporting substrate 23 was 48.0%, revealing that different from Examples 1 and 2, the Li content decreased from that of the initial LT substrate. In Comparative Example, the ion implanted surface of the LT film 21 is bonded to the supporting substrate 23 and a surface portion 21a on the ion implantation side is placed on the side of the supporting substrate 23 and a deep portion 21b is exposed. In fact, the Li content decreased in the layer about 300 nm deep from the exposed surface 22 of the LT film 21 (deep portion 21b in FIG. 2), while there was no decrease in the Li content in the layer about 650 nm thick from the supporting substrate 23 (surface portion 21a in FIG. 2).

REFERENCE SYMBOL LIST

1: Piezoelectric single-crystal substrate
11: Ion implantation layer
11a: Surface portion
11b: Deep portion
2: Temporary bonding substrate
3: Supporting substrate
4: First composite
5: Second composite
10: Composite substrate
20: Composite substrate (Comparative Example)
21: LT film
21a: Surface portion
21b: Deep portion
22: Separated interface
23: Supporting substrate

The invention claimed is:

1. A method of manufacturing a composite substrate equipped with a piezoelectric single-crystal film, the method comprising:
performing a first ion implantation treatment into a surface of a piezoelectric single-crystal substrate comprising lithium tantalate or lithium niobate to form a first ion implantation layer in the piezoelectric single-crystal substrate, wherein the first ion implantation treatment is performed with ion species containing at least one of a hydrogen atom ion ($H^+$) and a hydrogen molecule ion ($H_2^+$) at an ion implantation dose of $1.0\times10^{16}$ atoms/cm$^2$ or more and $3.0\times10^{17}$ atoms/cm$^2$ or less in terms of a hydrogen atom ion ($H^+$);
performing a second ion implantation treatment into a surface of a temporary bonding substrate to form a second ion implantation layer in the temporary bonding substrate, wherein the temporary bonding substrate is a single-crystal silicon substrate;
bonding the surface of the piezoelectric single-crystal substrate that has the first ion implantation layer to the surface of the temporary bonding substrate that has the second ion implantation layer;
separating the piezoelectric single-crystal substrate into the first ion implantation layer and a first remaining portion of the piezoelectric single-crystal substrate and removing the first remaining portion, thereby forming a piezoelectric single-crystal film having a thickness of 2 μm or less on the second ion implantation layer of the temporary bonding substrate;
bonding a supporting substrate to the piezoelectric single-crystal film; and
separating the temporary bonding substrate into the second ion implantation layer and a second remaining portion of the temporary bonding substrate and removing the second remaining portion, thereby forming a single-crystal silicon film having a thickness of 2 μm or less on the piezoelectric single-crystal film.

2. The method of manufacturing a composite substrate equipped with a piezoelectric single-crystal film according to claim 1, wherein the second ion implantation treatment into the surface of the temporary bonding substrate is performed with at least one of a hydrogen atom ion ($H^+$) and a hydrogen molecule ion ($H_2^+$) as ion species, an ion implantation dose is $1.0\times10^{16}$ atoms/cm$^2$ or more and $2.0\times10^{17}$ atoms/cm$^2$ or less in terms of a hydrogen atom ion ($H^+$), and the ion implantation dose into the temporary bonding substrate is set less than that into the piezoelectric single-crystal substrate.

3. The method of manufacturing a composite substrate equipped with a piezoelectric single-crystal film according to claim 1, wherein the separating the temporary bonding substrate into the second ion implantation layer and a second remaining portion of the temporary bonding substrate is achieved by at least one selected from a group consisting of heat treatment, mechanical impact, jetting, ultrasonic vibration, and photo irradiation.

4. The method of manufacturing a composite substrate equipped with a piezoelectric single-crystal film according to claim 1, wherein a material of the supporting substrate is selected from a group consisting of glass, silicon, quartz, sapphire, spinel, silicon carbide, silicon nitride, and aluminum nitride.

5. The method of manufacturing a composite substrate equipped with a piezoelectric single-crystal film according to claim 1, wherein the separating the piezoelectric single-crystal substrate into the first ion implantation layer and the first remaining portion of the piezoelectric single-crystal substrate is achieved by at least one selected from a group consisting of heat treatment, mechanical impact, jetting, ultrasonic vibration, and photo irradiation.

* * * * *